United States Patent
Roy

(10) Patent No.: US 6,649,831 B2
(45) Date of Patent: Nov. 18, 2003

(54) I-CHANNEL SURFACE-MOUNT CONNECTOR WITH EXTENDED FLANGES

(75) Inventor: Apurba Roy, Carlsbad, CA (US)

(73) Assignee: di/dt, Inc., Carlsbad, CA (US)

( * ) Notice: Subject to any disclaimer, the term of this patent is extended or adjusted under 35 U.S.C. 154(b) by 0 days.

(21) Appl. No.: 10/270,904

(22) Filed: Oct. 15, 2002

(65) Prior Publication Data

US 2003/0047344 A1 Mar. 13, 2003

Related U.S. Application Data

(60) Division of application No. 09/991,420, filed on Nov. 16, 2001, which is a continuation-in-part of application No. 09/737,303, filed on Dec. 15, 2000, now Pat. No. 6,503,088.

(51) Int. Cl.[7] .............................................. H01R 12/00
(52) U.S. Cl. ...................... 174/52.1; 361/785; 361/803; 439/65
(58) Field of Search ........................... 174/52.1; 439/65, 439/66, 74; 361/683, 803, 785, 786

(56) References Cited

U.S. PATENT DOCUMENTS

| | | | | |
|---|---|---|---|---|
| 4,470,655 A | * | 9/1984 | Kalka et al. ................. | 439/397 |
| 4,845,542 A | * | 7/1989 | Bezuk et al. ................. | 257/737 |
| 5,154,536 A | * | 10/1992 | Ciudaj ......................... | 404/118 |
| 5,324,892 A | * | 6/1994 | Granier et al. .............. | 174/250 |
| 5,422,516 A | * | 6/1995 | Hosokawa et al. .......... | 257/775 |
| 5,969,952 A | * | 10/1999 | Hayashi et al. ............. | 361/774 |
| 6,224,396 B1 | * | 5/2001 | Chan et al. .................... | 439/71 |
| 6,303,861 B1 | * | 10/2001 | Dobrinski et al. ........ | 174/5 SG |
| 6,319,829 B1 | * | 11/2001 | Pasco et al. ................. | 438/678 |
| 6,386,889 B1 | * | 5/2002 | Bishop ......................... | 439/66 |
| 6,429,388 B1 | * | 8/2002 | Interrante et al. ........... | 174/261 |

* cited by examiner

*Primary Examiner*—Dean A. Reichard
*Assistant Examiner*—Adolfo Nino
(74) *Attorney, Agent, or Firm*—Lowenstein Sandler PC

(57) ABSTRACT

In accordance with the invention, an I-channel surface mount connector comprising a length of cylindrical rod having a generally I-shaped cross section is improved by providing an extended mounting flange. When a first circuit device is connected to a second circuit device with the extended flange extending outward of the first device, the flange can extend beyond the periphery of the first device. This extension has the advantage that the solder bond between the flange and the second device can be easily inspected from above using visual inspection equipment.

6 Claims, 6 Drawing Sheets

I-CHANNEL SURFACE-MOUNT CONNECTOR WITH EXTENDED FLANGES

CROSS REFERENCE TO RELATED APPLICATIONS

This is a divisional of U.S. patent application Ser. No. 09/991,420 filed by Apurba Roy on Nov. 16, 2001 and entitled "I-Channel Surface-Mount Connector With Extended Flanges" which is a continuation-in-part of U.S. patent application No. Ser. 09/737,303 filed Dec. 15, 2000 by the present inventor and entitled "I-Channel Surface-Mount Connector". Ser. No. 09/991,420 issued as U.S. Pat. No. 6,503,088 on Jan. 7, 2003. The 09/737,303 application and the 09/991,420 application are incorporated herein by reference.

This application is a continuation-in-part of U.S. patent application Ser. No. 09/737,303 filed Dec. 15, 2000 by the present inventor and entitled "I-Channel Surface-Mount Connector". The 09/737,303 application is incorporated herein by reference.

FIELD OF THE INVENTION

This invention relates to devices for interconnecting circuit devices such as IC packages to circuit boards, circuit boards and modules to circuit boards or substrates, and substrates to substrates. Specifically, the invention relates to low impedance surface-mount connectors. In addition to having advantageous qualities of compactness, low interconnection resistance, low inductance, and mechanical compliance, the connectors permit easier inspection of the solder bonds between the circuit devices.

BACKGROUND OF THE INVENTION

As electronic circuits become denser, faster and increasingly complex, devices for interconnecting them are subject to more demanding requirements. With the great increase in the density of active components, interconnection devices become large consumers of available volume. And increased density brings an increase in required currents and power dissipation, aggravating thermal mismatch between connected circuit devices. In addition, higher circuit device speeds place stricter constraints on tolerable interconnect inductance.

U.S. patent application Ser. No. 09/737,303 describes a low impedance surface-mount connector comprising a length of cylindrical rod having an I-shaped cross section. The device permits interconnection by pick-and-place techniques. A first circuit device having one or more circuit components is interconnected with a second circuit device by surface mounting such connectors on the first circuit device, providing corresponding solder pads on the second circuit device, and mounting the connectors of the first circuit device onto the pads of the second.

This interconnection has advantageous qualities of low resistance, low inductance, mechanical compliance and ease of manufacture. However, it does not permit vertical visual inspection of the solder bonds at the point of connection of the first circuit device to the second. One looking down from above cannot see the solder connection between the connector and the solder pad on the second device. Accordingly there is a need for interconnection devices that can be inspected more easily.

SUMMARY OF THE INVENTION

In accordance with the invention, an I-channel surface mount connector comprising a length of cylindrical rod having a generally I-shaped cross section is improved by providing an extended mounting flange. When a first circuit device is connected to a second circuit device with the extended flange extending outward of the first device, the flange can extend beyond the periphery of the first device. This extension has the advantage that the solder bond between the flange and the second device can be easily inspected from above using visual inspection equipment.

BRIEF DESCRIPTION OF THE DRAWINGS

The advantages, nature and various additional features of the invention will appear more fully upon consideration of the illustrative embodiments now to be described in detail in connection with the accompanying drawings. In the drawings:

FIG. 6 is a top view showing the surface mounted connectors after being mounted on.

It is to be understood that these drawings are for illustrating the concepts of the invention and are not to scale.

DETAILED DESCRIPTION

Figure 1A:
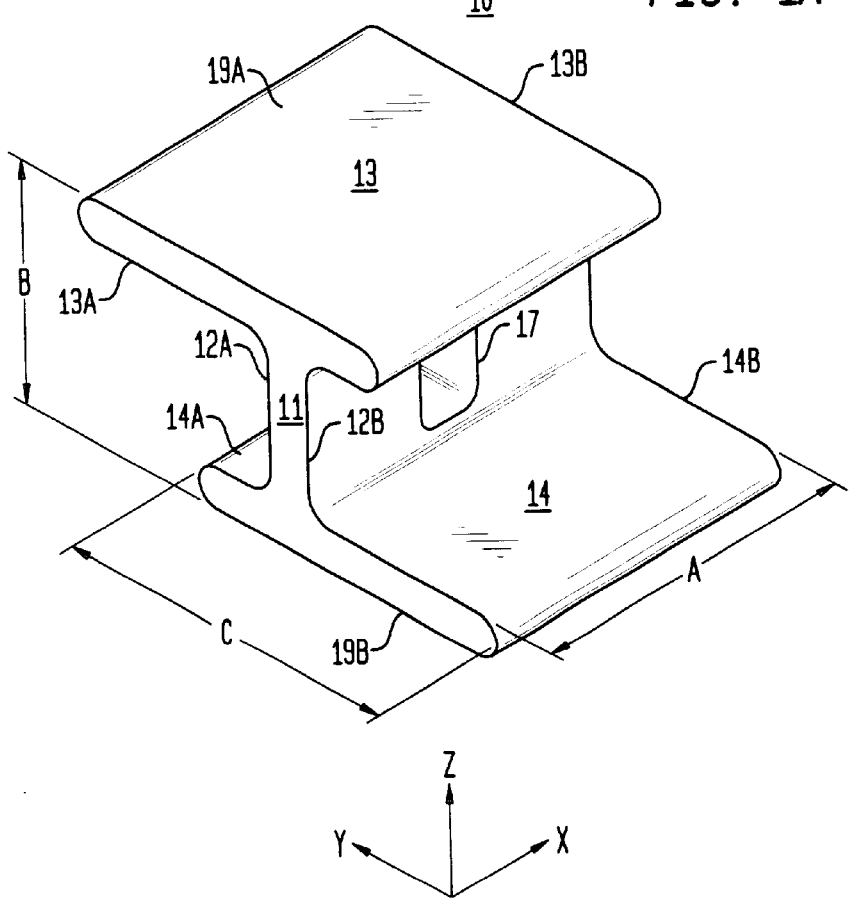
FIGS. 1A, 1B, 1C and 1D are perspective, end and side views of an I-channel surface mount connector with extended flanges in accordance with one embodiment of the invention.
Figure 1B:
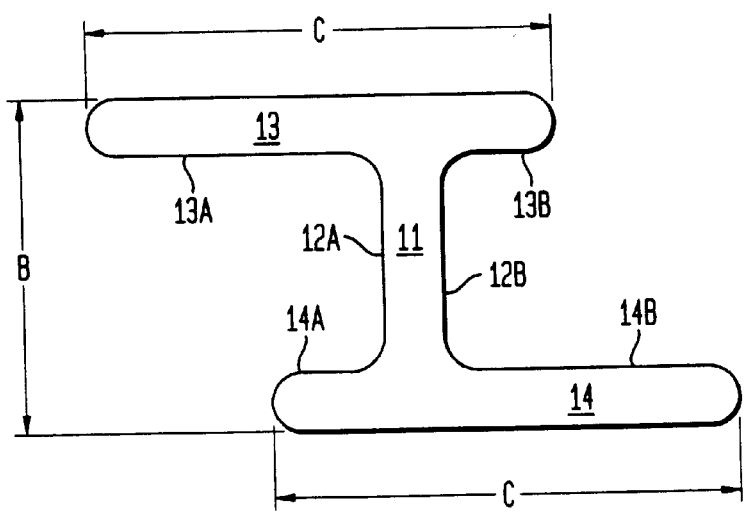
Figure 1C:
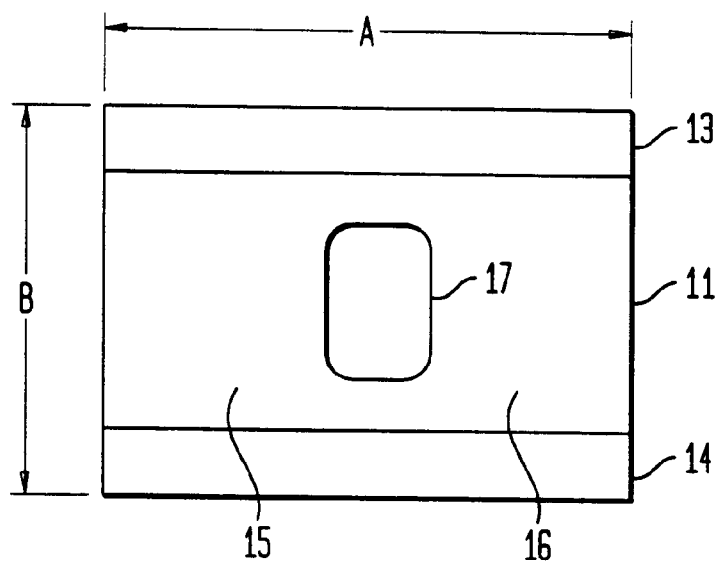

Referring to the drawings, FIGS. 1A, 1B and 1C are views of a novel surface mount connector 10 comprising an elongated metallic body of an essentially "I-shaped" cross section, with extended flanges of unequal length. The connector comprises a longitudinally extending central beam section 11 having a first side 12A and a second side 12B, and laterally extending base sections 13, 14 at both edges, comprising flanges 13A, 13B, 14A and 14B extending from the first and second sides of the central beam section 11. Flange 13A extending from the first side 12A of central beam section 11 is longer than flange 13B extending from the second side 12B of said central beam section. Flange 14B extending from the second side 12B of central beam section 11 is longer than flange 14A extending from the first side 12A of said central beam section. Flanges 13A and 14B can be of equal length. Flanges 13B and 14A can be of equal length.

Figure 1D:
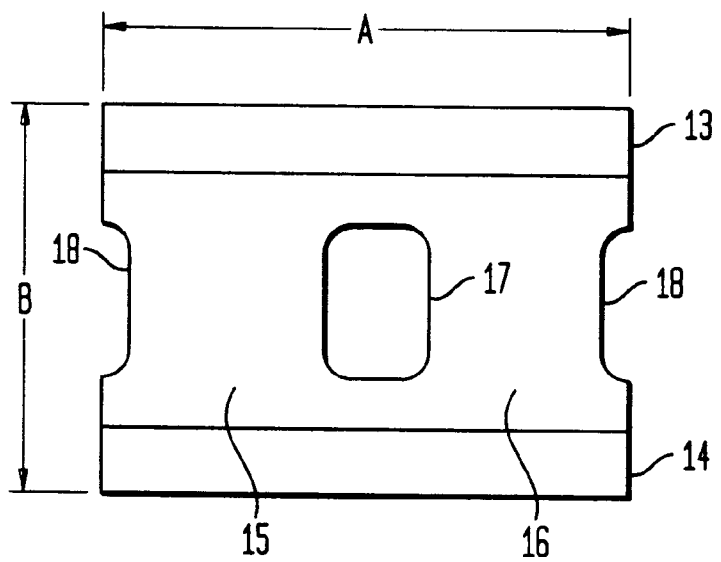

The longitudinal dimension of the connector can be divided into longitudinal sections 15, 16 by one or more slots 17. The ends of the body can include recessed regions 18, which can be formed as partial slots, as shown in FIG. 1D.

With reference to the coordinate system shown in FIG. 1, the connector 10 extends longitudinally along the x-axis. The major surfaces of the beam section 11 are parallel to the x-z plane, and the major surfaces of the base sections 13, 14 are parallel to the x-y plane. In the embodiments shown herein, the connector mounting surfaces are the outer major surface 19A of base 13 and the outer major surface 19B of base 14. The connector thus provides electrical and thermal connectivity in the z-direction.

In general, the connector length A is determined by the level of acceptable impedance for the connector. The greater the length, the lower the inductance and resistance. The height B is chosen to be greater than the height of the tallest component on the interconnect side of the circuit devices to be interconnected so that contact between the two circuit devices is only through the connectors. The base width C is chosen to meet visual inspection requirements and tipping requirements for the connector. The tipping requirements prescribe the maximum angle that the base outer surface can make with a planar substrate without falling over. Preferably the width C is sufficient to provide a tipping angle of at least 30°. The cross sectional corners of the base sections are advantageously rounded, as by a 7 mil radius, in order to provide a good fillet when soldered and thus produce reliable solder joints.

The presence and number of slots 17 is determined by the xy compliance requirements for the connector. A slot 17 will divide the beam section into two adjacent longitudinal sections 15, 16. Slots 17 should be dimensioned and placed so that the longitudinal dimension of each section 15, 16 does not exceed its height dimension. Thus if the length of a connector is less than its height, no slot is needed. If the length is greater than the height but not greater than twice the height, one slot is desirable. Recessed end regions 18 can reduce the effective length of the connector, reducing the need for slots to provide xy compliance. The optimal shape for a slot is geometrically similar to that of the central beam section 11, but rotated by 90°. A slot 17 can be confined to the beam section 11 as shown in FIG. 1 or can cut through one of the base sections.

These connectors can be easily fabricated by extruding a metal rod of an essentially I-shaped cross section with extended flanges, punching the desired slots and cutting to desired length. The connectors can achieve very low impedance (electrical and thermal) because the rods can be extruded of soft metals of high electrical and thermal conductivity such as copper or silver. Preferably the formed connector is plated with a solderable coating of Ni/Au or Ni/solder (e.g. tin-lead solder). The Ni advantageously has a thickness at least 50 microinch, the Au at least 3 microinch or the solder, at least 200 microinch.

Alternatively, the connectors can be fabricated as hollow cylinders of bent sheet material. The sheet material (e.g. 7 mil. sheet material) is punched to shape, folded into an essentially I-shaped cross section with extended flanges and the desired slots are punched. In this instance copper-based alloys such as Be—Cu or phosphor bronze are favored over soft copper or silver to provide rigidity at the cost of increased impedance.

Typical lengths A are in the range 0.030"–0.300". Typical heights B are in the range 0.040"–0.120", and typical base widths C are in the range 0.045" to 0.180". The central beam section 12 typically has a thickness in the range 0.010"–0.030", and the base sections 13, 14 typically have a thickness in the range 0.010"–0.030".

Figure 2:
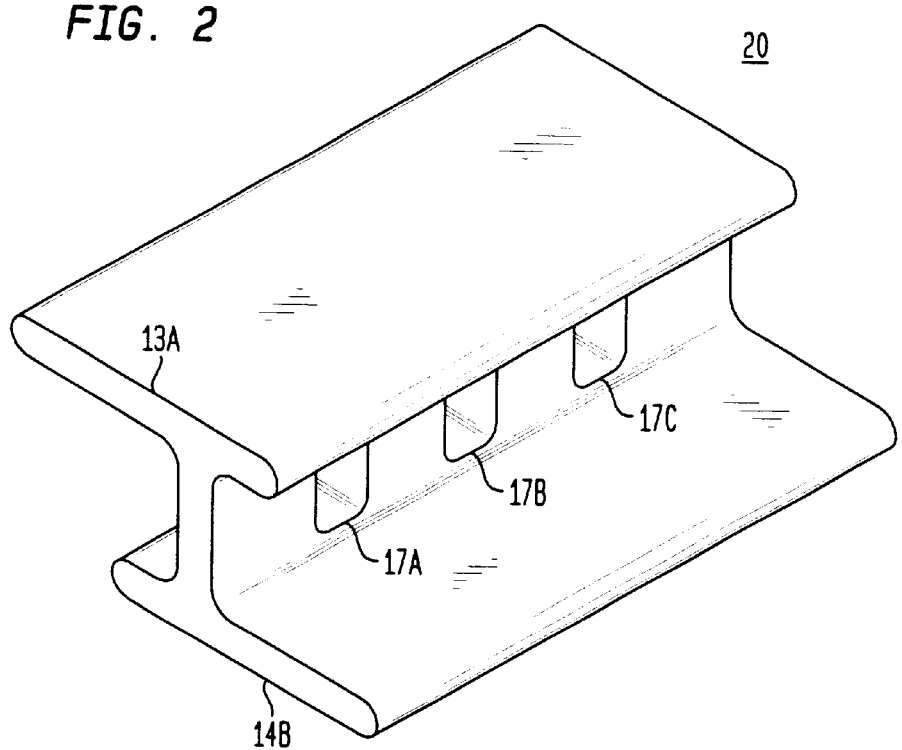
FIG. 2 illustrates an alternative embodiment employing a plurality of slots.

FIG. 2 is a perspective view of an alternative embodiment of a connector 20 similar to FIG. 1 except that the connector employs a plurality of slots 17A, 17B and 17C. The advantage of plural slots is that the connector, while still preserving xy-compliance, can have a greater length, providing reduced resistive, inductive, and thermal impedance. Advantageously the number of slots is sufficient to maintain the longitudinal extent of adjacent areas less than their height.

Figure 3:
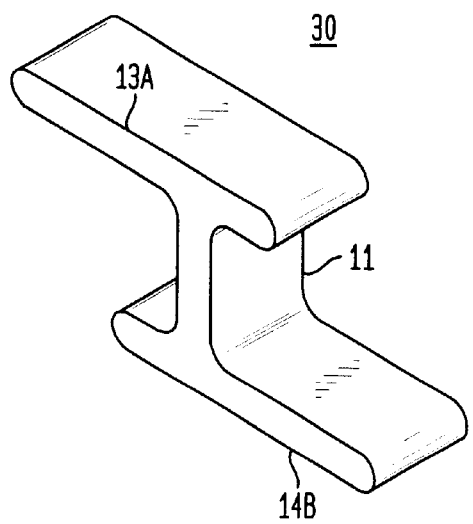
FIG. 3 is a perspective view of an embodiment employing no slots.

FIG. 3 is a perspective view of another embodiment of a connector 30 similar to FIG. 1 except that it is free of slots. This connector advantageously has a longitudinal dimension less than its height.

Figure 4A:
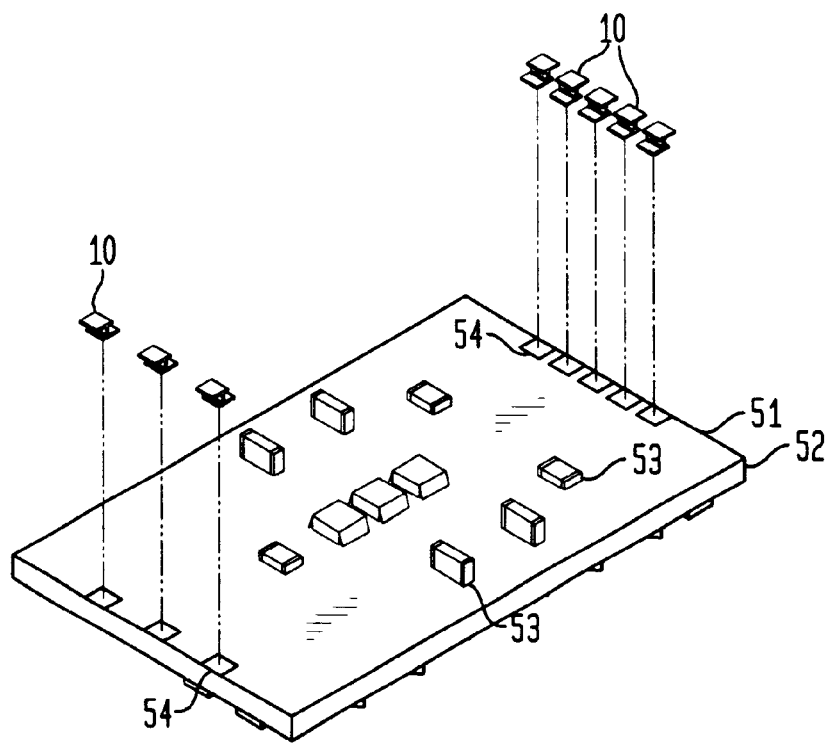
FIGS. 4A and 4B are perspective views showing surface mount connectors being mounted on a first circuit device.
Figure 4B:
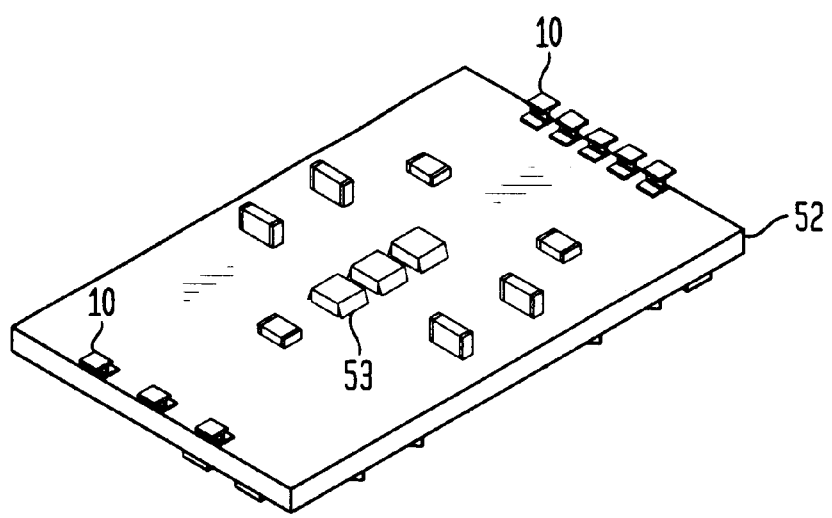

FIGS. 4A and 4B are perspective views showing surface mount connectors 10 being mounted on a first circuit device 51. The circuit device 51 comprises a substrate or circuit board 52, one or more circuit components 53 and one or more mounting pads 54 for receiving connectors 10. Advantageously pads 54 are pre-coated with solder. Preferably the height of connectors 10 is greater than the height of any circuit component 53. The connectors can then be placed on the pads by standard pick-and-place techniques, such that the longer flanges of the base sections distal to the substrate 52 extend outward away from the edge of such substrate so as to overhang the substrate. The connectors can be soldered to the pads in a conventional solder reflow step.

Figure 5A:
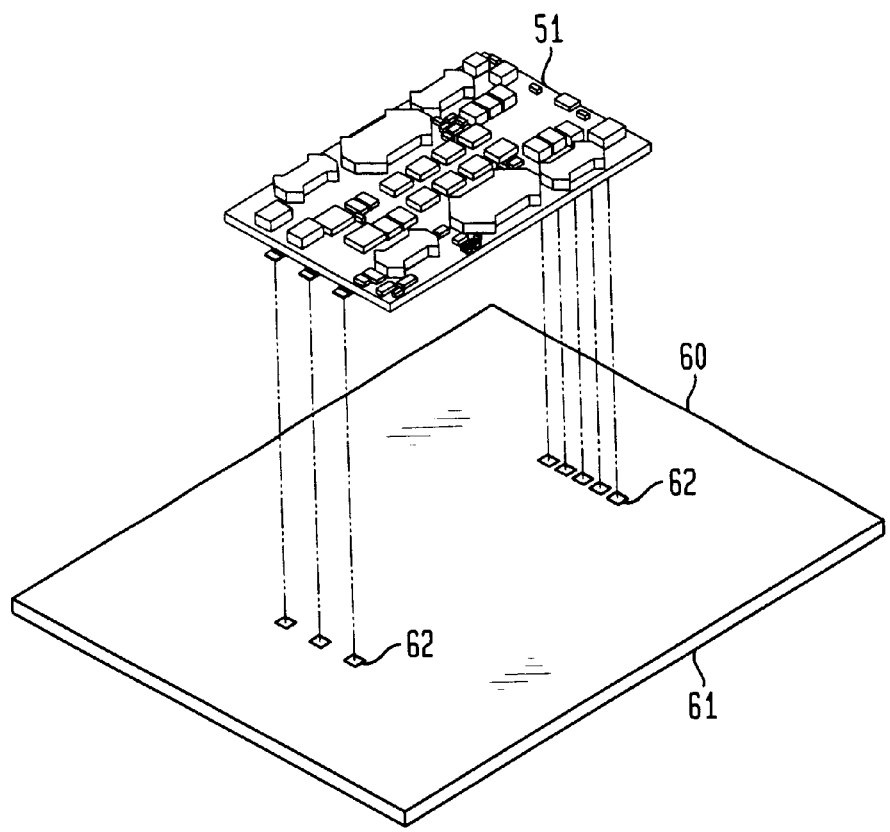
FIGS. 5A and 5B show the first circuit device being mounted on a second larger circuit device.
Figure 5B:
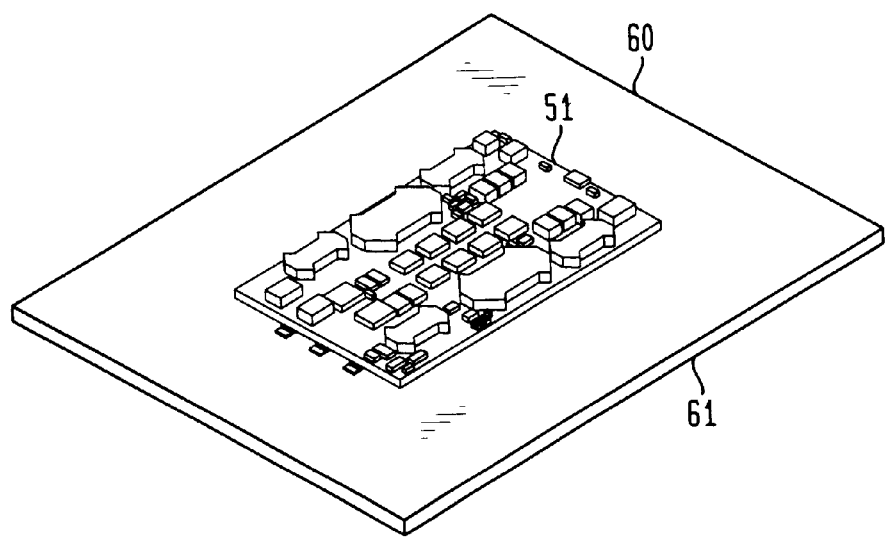

The next step shown in FIGS. 5A and 5B is to mount the first circuit device 51 onto a second circuit device 60. Device 60 can also comprise a package or substrate or circuit board 61 and is preferably the larger area circuit device of the two. As a preliminary step, circuit device 60 is provided with solder pads 62 appropriate in size and distribution for receiving the connectors mounted on circuit device 51. The pads 62 are preferably pre-coated with solder, and circuit device 51 can be applied on device 60 using pick-and-place techniques, with connectors 10 in registration with pads 62. The two circuit devices can then be interconnected by solder reflow. The result is an interconnected composite device having advantageous qualities of, compactness, low interconnection resistance, low inductance, mechanical compliance, and visual inspectibility of the solder joints between the connectors and the second circuit device.

Figure 6:
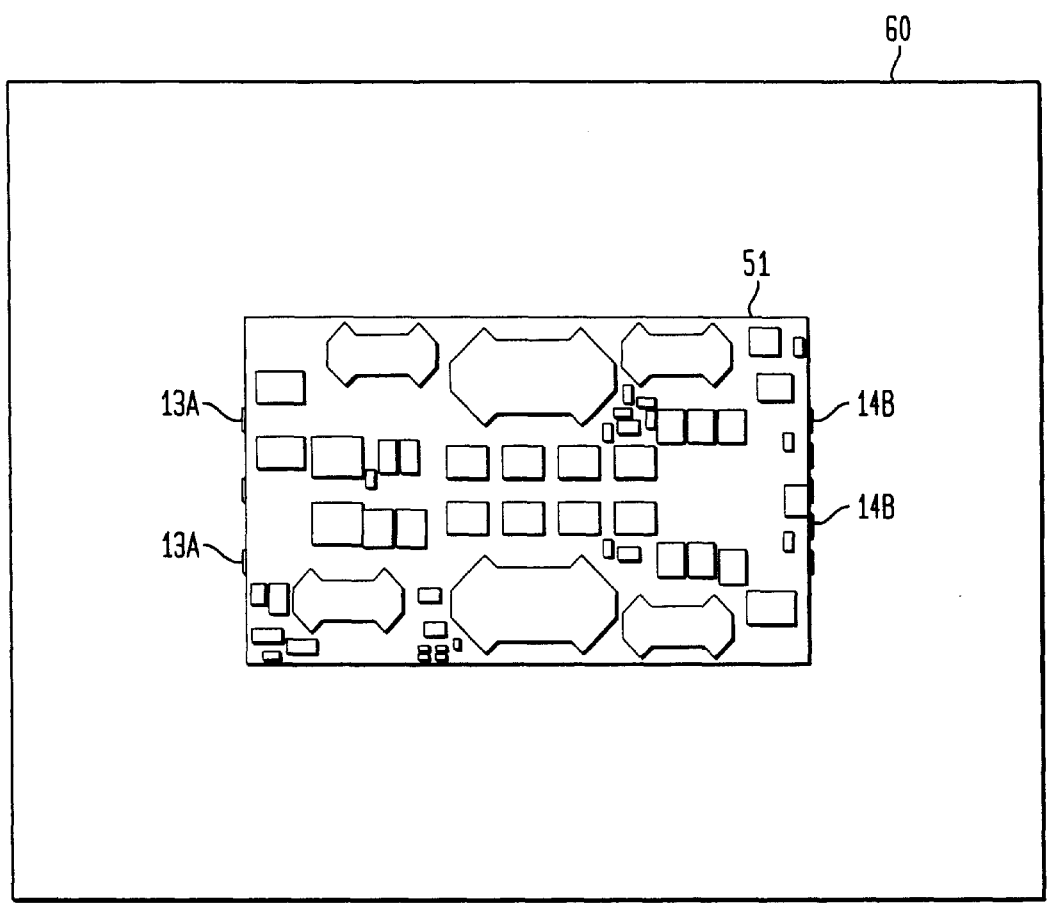

FIG. 6 shows surface mounted connectors 10 after being mounted on first and second circuit devices (51,60). As can be seen, the longer flanges of the base sections distal to the substrate 52 can be seen to extend beyond the edge of the substrate, facilitating visual inspection of the edges of the solder joints between the base sections proximate to substrate 61 that are created when the first circuit device is attached to a second circuit device by solder reflow.

The nature and advantages of the invention will become clearer by consideration of the following specific examples.

EXAMPLES

The principles of the invention were used to design devices of the type shown in FIG. 1 to meet the needs of a specific application. The application required a total of 8 surface-mount interconnects between a "circuit device" comprising a circuit board and a "motherboard" (a circuit board of larger area). The height of the tallest component on the interconnected side of the circuit device was H=0.070". The impedance requirements, dictated by device performance needs, were that each interconnect have a maximum inductance of 0.30 nH, and a maximum resistance of 50 micro-ohm. The mechanical requirement was compliance in both X and Y directions, in the face of thermal stress caused by large differentials between the operating temperature of the circuit device and the motherboard. The visual inspection requirement was that the portion of the interconnect directly in contact with the motherboard extend at least 0.020" beyond the edge of the circuit device. In addition, the area occupied by each interconnect needed to be very small, while still maintaining a minimum angle of tip of at least 30° for stability prior to reflow.

The device height B was chosen to be B=0.082", to meet the B>H requirement. Flange 13A was designed to be 0.044" longer than flange 13B, and flange 14B was designed to be 0.044" longer than flange 14A. This ensured on proper placement, that a minimum of 0.021" of a connector flange would extend horizontally beyond the edge of the circuit device so that it can be inspected from above. The base width C was selected as C=0.112", with a 0.007" radius at the cross sectional corners to facilitate adequate solder fillets. This combination of B, C and the radius yielded a minimum angle of tip of 38°. To provide necessary compliance in the Y direction and mechanical stability, the thickness of the central beam section was selected to be 0.015", and that of the basesection was selected to be 0.014".

Once the above dimensions were fixed, the connector length A and width of the slot were determined on the basis of meeting the requirements for impedance and X-directional compliance. A length of A=0.100" and a slot width of 0.020" were found adequate, in conjunction with the selection of copper, USN nomenclature C11000, as the device material. The inductance was calculated to be 0.27 nH, and the resistance was 35 micro-ohm. The device footprint was 0.100"×0.112", with a pad size of 0.116"× 0.128". Thus, all requirements of the application were satisfied.

It is to be understood that the above-described embodiments are illustrative of only a few of the many possible specific embodiments which can represent applications of the principles of the invention. Numerous and varied other arrangements can be readily devised by those skilled in the art without departing from the spirit and scope of the invention.

What is claimed is:

1. A method for interconnecting a first circuit device to a second circuit device comprising the steps of:
    providing said first circuit device with one or more mounting pads;
    placing on each said mounting pad a surface-mount connector having an extended base being positioned distal to the mounting pads, the extended base extending laterally outward away from the edge of the first circuit device so as to extend beyond the periphery of the first circuit device,
    soldering said one or more connectors to said first circuit device;
    providing a second circuit device with one or more mounting pads for receiving the extended bases of the connectors on said first circuit device;
    placing said first circuit device on said second circuit device with the extended bases on said mounting pads of said second circuit device and, viewed from above the first device, the extended bases extending laterally beyond the edge of the first device;
    soldering said extended bases to said mounting pads on said second surface device;
    and visually inspecting from above the first device, the solder bonding between the extended bases and the mounting pads of the second device.

2. The method of claim 1 wherein at least one of the surface-mount connectors is soldered to the first circuit device by solder reflow.

3. The method of claim 1 wherein the extended bases of the surface-mount connectors on the first circuit device are soldered to the second circuit device by solder reflow.

4. A method for interconnecting a first circuit device to a second circuit device comprising the steps of providing said first circuit device with one or more mounting pads; placing on each said mounting pad a surface-mount connector; soldering the one or more connectors to said first circuit device; providing a second circuit device with one or more mounting pads for receiving said connectors on said first circuit device; placing said first circuit device on said second circuit device with said connectors on said mounting pads of said second circuit device; and soldering said connectors to said mounting pads on said second surface device;
    wherein the surface-mount connector comprises a metallic body of an essentially I-shaped transverse cross section, the body comprising a longitudinally extending central beam section having first and a second sides and first and second longitudinally extending edges, and further having at each longitudinally extending edge, a laterally extending base section comprising first and second flanges extending from the first and second sides of the central beam section, wherein the first flange of at least one base section is of greater length than the second flange of the same base section, and each base section having a mounting surface perpendicular to the central beam section for bonding to a circuit device,
    each surface-mount connector placed on each said mounting pad such that a base section having a longer first flange is positioned distal to the mounting pads and such that the longer first flange extends outward away from the edge of the first circuit device so as to overhang the first circuit device.

5. The method of claim 4 wherein the flange at the first longitudinally extending edge extending from the first side of the central beam section is longer than the flange at the first longitudinally extending edge extending from the second side of the central beam section, and is equal in length to the flange at the second longitudinally extending edge extending from the second side of the central beam section.

6. The method of claim 4 wherein the flange at the first longitudinally extending edge extending from the second side of the central beam is equal in length to the flange at the second longitudinally extending edge extending from the first side of the central beam section.

* * * * *